United States Patent
Li et al.

(10) Patent No.: US 10,651,578 B2
(45) Date of Patent: May 12, 2020

(54) CONNECTOR AND CONNECTOR ASSEMBLY

(71) Applicant: Tyco Electronics (Shanghai) Co. Ltd., Shanghai (CN)

(72) Inventors: Hua Li, Shanghai (CN); Guangming Zhao, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 16/106,851

(22) Filed: Aug. 21, 2018

(65) Prior Publication Data

US 2019/0067851 A1 Feb. 28, 2019

(30) Foreign Application Priority Data

Aug. 23, 2017 (CN) .................... 2017 2 1059708 U

(51) Int. Cl.
| | |
|---|---|
| *H01R 12/70* | (2011.01) |
| *H01R 25/14* | (2006.01) |
| *H02B 1/20* | (2006.01) |
| *H05K 7/14* | (2006.01) |
| *H01R 13/629* | (2006.01) |
| *H01R 12/72* | (2011.01) |
| *H01R 12/57* | (2011.01) |
| *H01R 13/26* | (2006.01) |
| *H01R 103/00* | (2006.01) |

(52) U.S. Cl.
CPC ....... *H01R 12/7088* (2013.01); *H01R 13/629* (2013.01); *H01R 25/14* (2013.01); *H02B 1/20* (2013.01); *H05K 7/1457* (2013.01); *H01R 12/57* (2013.01); *H01R 12/7047* (2013.01); *H01R 12/721* (2013.01); *H01R 13/26* (2013.01); *H01R 2103/00* (2013.01)

(58) Field of Classification Search
CPC .. H01R 12/7088; H01R 13/629; H01R 25/14; H01R 12/57
USPC .......................................... 439/78
See application file for complete search history.

(56) References Cited

U.S. PATENT DOCUMENTS

| | | | | |
|---|---|---|---|---|
| 4,087,666 A | * | 5/1978 | DeHaitre | H01R 12/526 200/507 |
| 5,228,873 A | * | 7/1993 | Hirai | H01R 12/7023 439/607.4 |
| 5,431,576 A | * | 7/1995 | Matthews | H01R 13/113 439/247 |
| 5,442,142 A | * | 8/1995 | Hayashi | H05K 1/0263 174/250 |
| 6,354,846 B1 | * | 3/2002 | Murakami | H01R 9/226 439/148 |
| 6,530,811 B1 | * | 3/2003 | Padulo | H01H 73/08 361/634 |

(Continued)

*Primary Examiner* — Alexander Gilman
(74) *Attorney, Agent, or Firm* — Barley Snyder

(57) ABSTRACT

A connector comprises an insulating body and a plurality of terminals including a first terminal and a second terminal held in the insulating body. The first terminal has a first connecting leg and the second terminal has a second connecting leg. The first connecting leg and the second connecting leg are located at different positions along a height direction. The first connecting leg is electrically connectable to a first busbar at a different height in the height direction than the second connecting leg is electrically connectable to a second busbar.

20 Claims, 3 Drawing Sheets

(56) References Cited

U.S. PATENT DOCUMENTS

| | | | |
|---|---|---|---|
| 7,186,121 B1* | 3/2007 | Costello | H01R 12/7005 439/79 |
| 7,581,972 B2* | 9/2009 | Daamen | H01R 13/6315 439/249 |
| 8,388,389 B2 | 3/2013 | Costello et al. | |
| 8,575,494 B2* | 11/2013 | Tien | H05K 1/111 174/260 |
| 8,576,578 B2* | 11/2013 | Ayers | H05K 1/0298 361/679.02 |
| 8,942,006 B2* | 1/2015 | Baker | H05K 3/4688 174/251 |
| 9,054,470 B2* | 6/2015 | YuQiang | H01R 27/02 |
| 9,106,009 B2* | 8/2015 | Zhao | H01R 12/585 |
| 9,166,309 B1* | 10/2015 | Costello | H01R 25/161 |
| 9,184,431 B2* | 11/2015 | Frias | H01M 2/204 |
| 9,680,236 B2* | 6/2017 | Ngo | H01R 12/724 |
| 9,839,131 B2* | 12/2017 | Chamberlin | H05K 3/3447 |
| 9,877,394 B2* | 1/2018 | Bordonado | H01F 27/06 |
| 9,882,321 B1* | 1/2018 | Hibbs | H01R 24/60 |
| 9,991,616 B2* | 6/2018 | Axelowitz | H01R 12/721 |
| 2013/0012072 A1* | 1/2013 | Costello | H01R 13/18 439/660 |

* cited by examiner

CONNECTOR AND CONNECTOR ASSEMBLY

CROSS-REFERENCE TO RELATED APPLICATION

This application claims the benefit of the filing date under 35 U.S.C. § 119(a)-(d) of Chinese Patent Application No. 201721059708.X, filed on Aug. 23, 2017, the whole disclosure of which is incorporated herein by reference.

FIELD OF THE INVENTION

The present invention relates to a connector and, more particularly, to a power connector for a busbar.

BACKGROUND

A power connector generally includes an insulating body, a positive terminal, and a negative terminal. Both the positive terminal and the negative terminal are held in the insulating body. A connecting leg at one end of the positive terminal is electrically connected to a positive busbar via a wire, and a connecting leg at one end of the negative terminal is electrically connected to a negative busbar via a wire. In such an electrical connection, additional wires are required, resulting in an increased complexity of the connecting structure, an increase in cost, and requiring a larger installation space.

A first socket and a second socket are generally formed in the insulating body. A resilient electrical contact portion of the positive terminal is received in the first socket so as to be in electrical contact with a mating positive busbar inserted into the first socket. A resilient electrical contact portion of the negative terminal is received in the second socket so as to be in electrical contact with a mating negative busbar inserted into the second socket. Since this type of connector has two sockets, its structure is relatively complicated, the cost is high, and the size of the connector is increased, which is not conducive to miniaturization of the connector.

SUMMARY

A connector comprises an insulating body and a plurality of terminals including a first terminal and a second terminal held in the insulating body. The first terminal has a first connecting leg and the second terminal has a second connecting leg. The first connecting leg and the second connecting leg are located at different positions along a height direction. The first connecting leg is electrically connectable to a first busbar at a different height in the height direction than the second connecting leg is electrically connectable to a second busbar.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
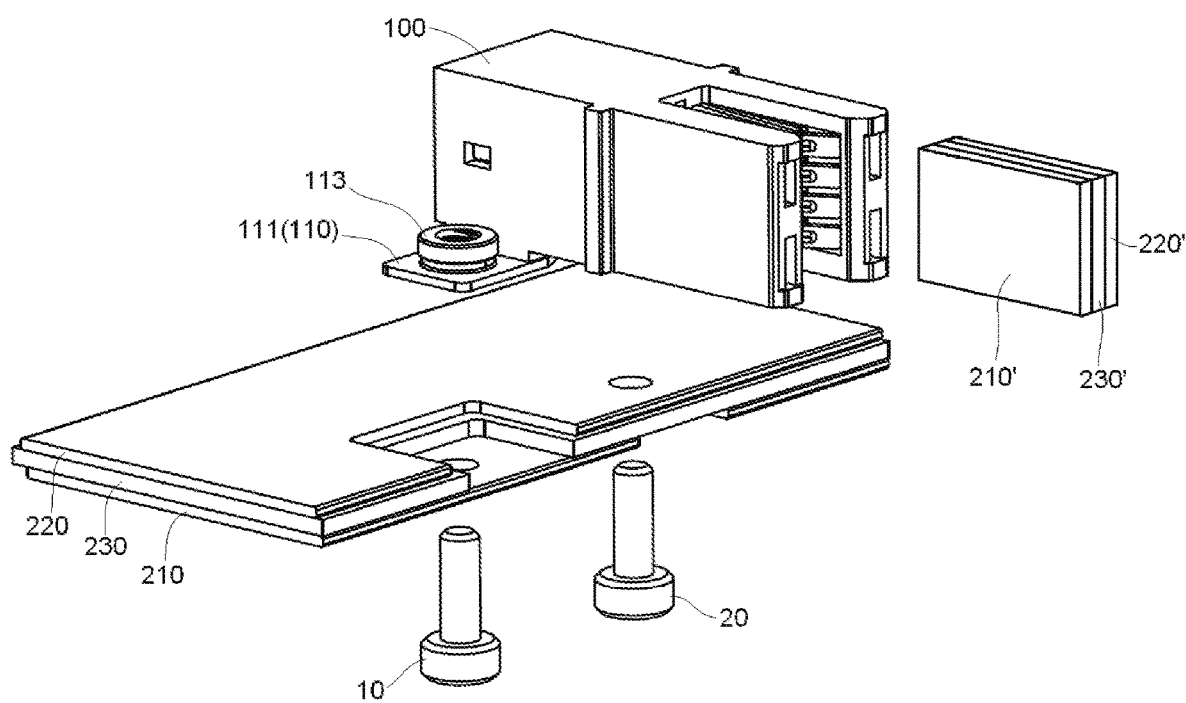
FIG. 1 is an exploded perspective view of a connector assembly according to an embodiment.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In addition, in the following detailed description, for purposes of explanation, numerous specific details are set forth in order to provide a thorough understanding of the disclosed embodiments. However, it is apparent that one or more embodiments may also be implemented without these specific details. In other instances, well-known means and devices are schematically shown in the drawings to simplify the drawings.

A connector assembly according to an embodiment, as shown in FIG. 1, includes a connector and a busbar assembly 210, 220, 230. The connector, as shown in FIGS. 1 and 2, has an insulating body 100 and a plurality of terminals 110, 120 including first and second terminals 110 and 120 which both are held in the insulating body 100.

Figure 3:
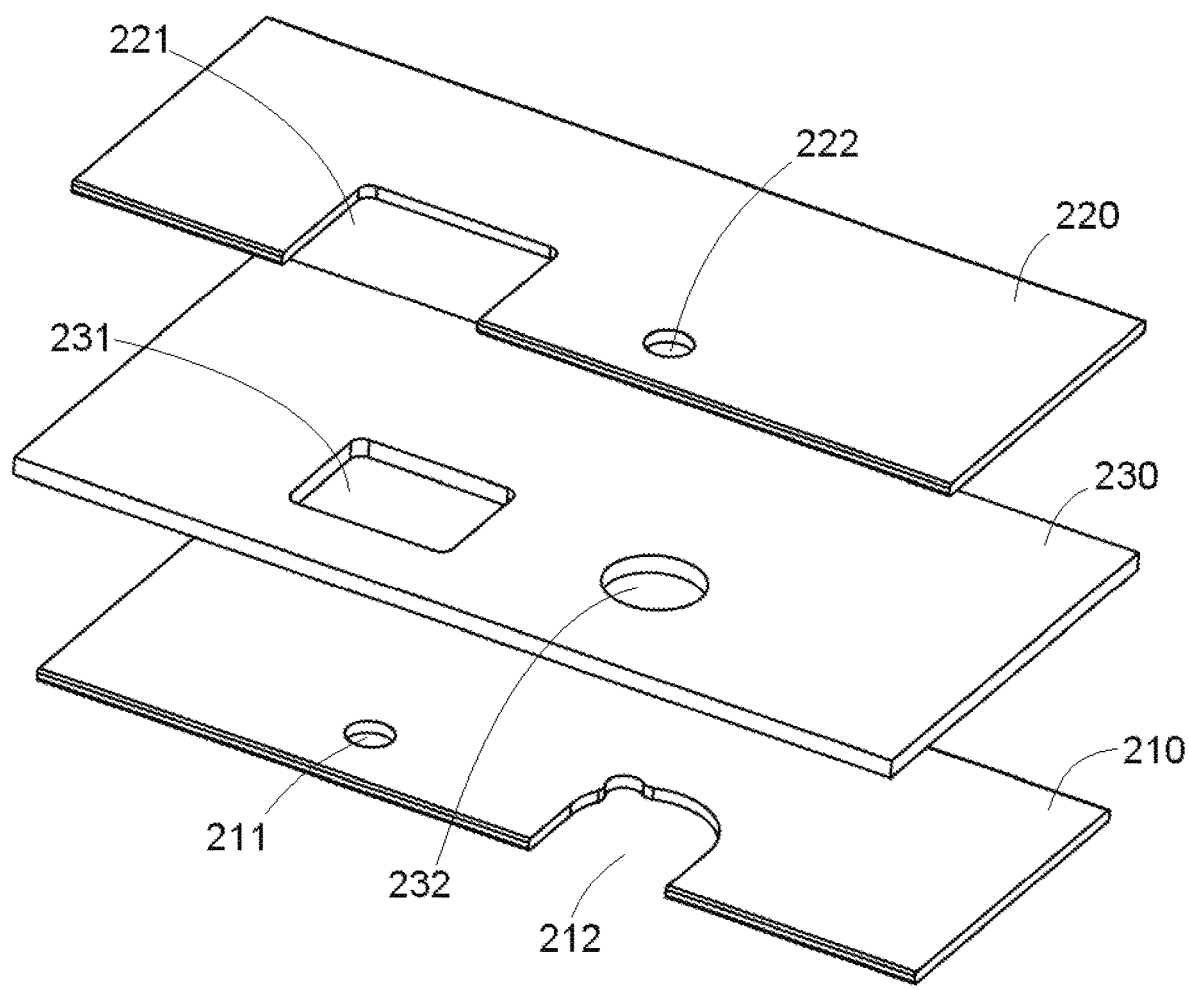
FIG. 3 is an exploded perspective view of a busbar assembly of the connector assembly.

As shown in FIGS. 1 and 3, the busbar assembly 210, 220, 230 includes a first busbar 210, a second busbar 220, and an insulating isolation layer 230 disposed between the first busbar 210 and the second busbar 220. The insulating isolation layer 230 electrically isolates the first busbar 210 from the second busbar 220. A first opening 221 is formed in the second busbar 220 and a first window 231 corresponding to the first opening 221 is formed in the insulating isolation layer 230, as shown in FIG. 3. The first busbar 210 and the second busbar 220 are bonded to each other by the insulating isolation layer 230, so that the busbar assembly 210, 220, 230 is formed into an integral component.

Figure 2:
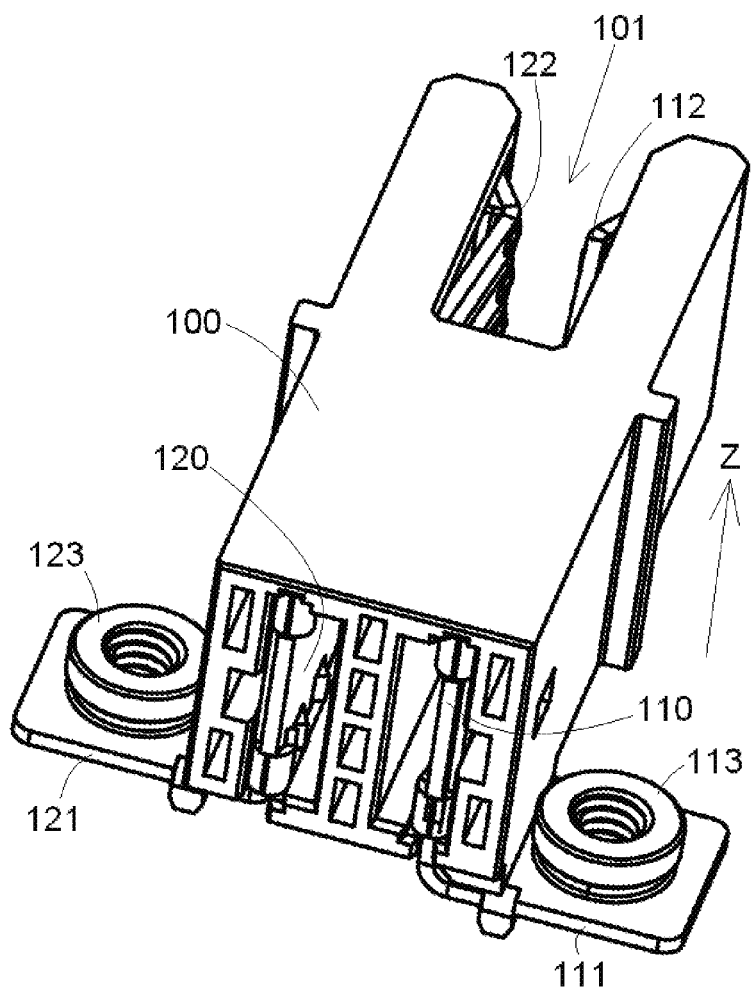
FIG. 2 is a perspective view of a connector of the connector assembly.

As shown in FIGS. 1-3, the first terminal 110 has a first connecting leg 111. The first connecting leg 111 is received in the first opening 221 and the first window 231 and is electrically connected to a surface of the first busbar 210. The second terminal 120 has a second connecting leg 121. The second connecting leg 121 is electrically connected to a surface of the second busbar 220. The first connecting leg 111 is directly placed on the surface of the first busbar 210 and is in direct electrical contact with the surface of the first busbar 210. The second connecting leg 121 is directly placed on the surface of the second busbar 220 and is in direct electrical contact with the surface of the second busbar 220. The first connecting leg 111 has a contact bottom surface that is in direct electrical contact with the surface of the first busbar 210 and the second connecting leg 121 has a contact bottom surface that is in direct electrical contact with the surface of the second busbar 220.

The contact bottom surface of the first connecting leg 111 is lower than the contact bottom surface of the second connecting leg 121 in a height direction Z shown in FIG. 2. The distance between the contact bottom surface of the first connecting leg 111 and the contact bottom surface of the second connecting leg 121 in the height direction Z is equal to a sum of a thickness of the second busbar 220 and a thickness of the insulating isolation layer 230.

The connector assembly, as shown in FIGS. 1-3, further includes a first threaded connecting component 10, 113. The first threaded connecting component 10, 113 is adapted to connect the first connecting leg 111 to the first busbar 210, so that the first connecting leg 111 is in direct electrical contact with the first busbar 210. In the shown embodiment, the first threaded connecting component 10, 113 includes a first bolt 10 and a first nut 113. A stem of the first bolt 10 passes through the first busbar 210 and the first connecting leg 111 and is screwed to the first nut 113 so as to connect the first connecting leg 111 to the first busbar 210. The first nut 113 may be welded to a top surface of the first connecting leg 111 or may be an individual component separable from the first connecting leg 111. As shown in FIG. 3, a through hole 211 allowing the stem of the first bolt 10 to pass through is formed in the first busbar 210.

The connector assembly, as shown in FIGS. 1-3, further includes a second threaded connecting component 20, 123. The second threaded connecting component 20, 123 is adapted to connect the second connecting leg 121 to the second busbar 220 such that the second connecting leg 121 is in direct electrical contact with the second busbar 220. In the shown embodiment, the second threaded connecting component 20, 123 includes a second bolt 20 and a second nut 123. As shown in FIG. 3, a second opening 212 is formed in the first busbar 210 and a second window 232 corresponding to the second opening 212 is formed in the insulating isolation layer 230. A head of the second bolt 20 is received in the second opening 212 and the second window 232. A stem of the second bolt 20 passes through the second busbar 220 and the second connecting leg 121 and is screwed to the second nut 123 so that the second connecting leg 121 is connected to the second busbar 220. The second nut 123 may be welded to a top surface of the second connecting leg 121 or may be an individual component separable from the second connecting leg 121. As shown in FIG. 3, a through hole 222 allowing the stem of the second bolt 20 to pass through is formed in the second busbar 220.

As shown in FIGS. 1-3, when the first connecting leg 111 of the first terminal 110 is electrically connected to the first busbar 210, the first connecting leg 111 is not in contact with an inner wall of the first opening 221 in the second busbar 220 to prevent the second busbar 220 from being in electrical contact with the first connecting leg 111. When the second connecting leg 121 of the second terminal 120 is electrically connected to the second busbar 220, the second bolt 20 is not in contact with an inner wall of the second opening 212 in the first busbar 210 to prevent the first busbar 210 from being electrically connected to the second busbar 220 via the second bolt 20. In an embodiment, the second bolt 20 may be enclosed by an insulating layer. In this way, the first busbar 210 may be prevented from being electrically connected to the second busbar 220 via the second bolt 20.

As shown in FIGS. 1 and 2, a single socket 101 is formed in the insulating body 100 of the connector and the first terminal 110 has a first resilient contact portion 112 on a first side of the interior of the socket 101. The second terminal 120 has a second resilient contact portion 122 on a second side of the interior of the socket 101 opposite the first side.

In an embodiment shown in FIG. 1, the connector assembly further includes a mating busbar assembly adapted to be inserted into the aforementioned socket 101 and mated with the aforementioned busbar assembly. The mating busbar assembly includes a first mating busbar 210', a second mating busbar 220', and an intermediate insulating layer 230' located between the first mating busbar 210' and the second mating busbar 220'. The intermediate insulating layer 230' electrically isolates the first mating busbar 210' from the second mating busbar 220'.

When the mating busbar assembly is inserted into the socket 101 in the connector, the first mating busbar 210' and the second mating busbar 220' of the mating busbar assembly are in electrical contact with the first resilient contact portion 112 and the second resilient contact portion 122 of the connector, respectively, so as to be electrically connectable to the first busbar 210 and the second busbar 220 of the busbar assembly via the first terminal 110 and the second terminal 120 of the connector, respectively. In an embodiment, the first mating busbar 210' and the second mating busbar 220' are bonded to each other by the intermediate insulating layer 230', so that the mating busbar assembly is formed into an integral component.

In the aforementioned embodiments, the connecting legs 111, 121 of the first and second terminals 110, 120 of the connector are located at positions different in height so that the first and second terminals 110, 120 may be electrically connected to the first busbar 210 and the second busbar 220 at different heights, respectively, without any connecting wires. By doing so, the connecting structure between the connector and the busbar assembly 210, 220, 230 may be simplified and the number of connecting parts may be reduced, so that the cost and the installation space may be reduced.

In addition, because a first opening 221 for receiving the connecting leg 111 of the first terminal 110 is formed in the second busbar 220, the first connecting leg 111 of the first terminal 110 may be accommodated in the first opening 221 in the second busbar 220 and is directly electrically connected to the first busbar 210 located below the first opening 221 of the second busbar 220. The second connecting leg 121 of the second terminal 120 may be directly connected to the second busbar 220. In this way, since there is no need for any connecting wires, the connecting structure between the connector and the busbar may be simplified and the number of the connecting parts may be reduced, so that the cost and the installation space may be reduced.

Further, a single socket 101 is formed in the insulating body 100 of the connector, and the resilient contact portions 112, 122 of the first terminal and the second terminal 110, 120 are located on both sides of the interior of the socket 101 and may be respectively in electrical contact with the first mating busbar 210' and the second mating busbar 220' of the mating busbar assembly that are inserted into the socket 101. Since only a single socket 101 is formed in the insulating body 100 of the connector, the size, the cost and the installation space of the connector may be reduced.

What is claimed is:

1. A connector, comprising:
    an insulating body; and
    a plurality of terminals including a first terminal and a second terminal held in the insulating body, the first terminal having a first connecting leg and the second terminal having a second connecting leg, the first connecting leg and the second connecting leg are located at different positions along a height direction and the first connecting leg is electrically connectable to a first busbar at a different height in the height direction than the second connecting leg is electrically connectable to a second busbar, the first terminal is electrically isolated from the second terminal.

2. The connector of claim 1, wherein the first connecting leg has a contact bottom surface adapted to be in direct electrical contact with a surface of the first busbar, the second connecting leg has a contact bottom surface adapted to be in direct electrical contact with a surface of the second busbar, and the contact bottom surface of the first connecting leg is lower than the contact bottom surface of the second connecting leg in the height direction.

3. The connector of claim 2, further comprising a first threaded connecting component and a second threaded connecting component, the first threaded connecting component adapted to connect the first connecting leg to the first busbar and the second threaded connecting component adapted to connect the second connecting leg to the second busbar.

4. The connector of claim 3, wherein the first threaded connecting component includes a first bolt and a first nut, the first bolt being adapted to pass through the first busbar and the first connecting leg to be screwed to the first nut to connect the first connecting leg to the first busbar, and the second threaded connecting component includes a second bolt and a second nut, the second bolt being adapted to pass through the second busbar and the second connecting leg to be screwed to the second nut to connect the second connecting leg to the second busbar.

5. The connector of claim 4, wherein the first nut is welded to a top surface of the first connecting leg or is an individual component separable from the first connecting leg, and the second nut is welded to a top surface of the second connecting leg or is an individual component separable from the second connecting leg.

6. The connector of claim 4, wherein at least one of the first bolt and the second bolt is enclosed by an insulating layer.

7. The connector of claim 1, wherein a single socket is formed in the insulating body, the first terminal has a first resilient contact portion at a first side of an interior of the socket and the second terminal has a second resilient contact portion at a second side of the interior of the socket opposite the first side, and the first resilient contact portion is adapted to be in electrical contact with a first mating busbar inserted into the socket and the second resilient contact portion is adapted to be in electrical contact with a second mating busbar inserted into the socket.

8. A connector assembly, comprising:
a connector including an insulating body and a plurality of terminals including a first terminal and a second terminal held in the insulating body, the first terminal having a first connecting leg and the second terminal having a second connecting leg, the first terminal is electrically isolated from the second terminal; and
a busbar assembly including a first busbar, a second busbar, and an insulating isolation layer disposed between the first busbar and the second busbar and electrically isolating the first busbar from the second busbar, a first opening is formed in the second busbar and a first window corresponding to the first opening is formed in the insulating isolation layer, the first connecting leg is received in the first opening and the first window and is electrically connected to a surface of the first busbar and the second connecting leg is electrically connected to a surface of the second busbar.

9. The connector assembly of claim 8, wherein the first connecting leg is directly placed on the surface of the first busbar and is in direct electrical contact with the surface of the first busbar, and the second connecting leg is directly placed on the surface of the second busbar and is in direct electrical contact with the surface of the second busbar.

10. The connector assembly of claim 9, wherein the first connecting leg has a contact bottom surface that is in direct electrical contact with the surface of the first busbar, the second connecting leg has a contact bottom surface that is in direct electrical contact with the surface of the second busbar, and the contact bottom surface of the first connecting leg is lower than the contact bottom surface of the second connecting leg in a height direction.

11. The connector assembly of claim 10, wherein a distance between the contact bottom surface of the first connecting leg and the contact bottom surface of the second connecting leg in the height direction is equal to a sum of a thickness of the second busbar and a thickness of the insulating isolation layer.

12. The connector assembly of claim 9, further comprising a first threaded connecting component adapted to connect the first connecting leg to the first busbar with the first connecting leg in direct electrical contact with the first busbar.

13. The connector assembly of claim 12, wherein the first threaded connecting component includes a first bolt and a first nut, a stem of the first bolt passing through the first busbar and the first connecting leg to be screwed to the first nut to connect the first connecting leg to the first busbar.

14. The connector assembly of claim 13, wherein the first nut is welded to a top surface of the first connecting leg or is an individual component separable from the first connecting leg.

15. The connector assembly of claim 13, further comprising a second threaded connecting component adapted to connect the second connecting leg to the second busbar with the second connecting leg in direct electrical contact with the second busbar.

16. The connector assembly of claim 15, wherein the second threaded connecting component includes a second bolt and a second nut, a stem of the second bolt passing through the second busbar and the second connecting leg to be screwed to the second nut to connect the second connecting leg to the second busbar.

17. The connector assembly of claim 16, wherein the second nut is welded to a top surface of the second connecting leg or is an individual component separable from the second connecting leg.

18. The connector assembly of claim 16, wherein a second opening is formed in the first busbar and a second window corresponding to the second opening is formed in the insulating isolation layer, a head of the second bolt is received in the second opening and the second window.

19. The connector assembly of claim 8, further comprising a mating busbar assembly including a first mating busbar and a second mating busbar, a single socket is formed in the insulating body, the first terminal has a first resilient contact portion at a first side of an interior of the socket and the second terminal has a second resilient contact portion at a second side of the interior of the socket opposite the first side, and the first resilient contact portion is adapted to be in electrical contact with a first mating busbar inserted into the socket and the second resilient contact portion is adapted to be in electrical contact with a second mating busbar inserted into the socket.

20. The connector assembly of claim 16, wherein at least one of the first bolt and the second bolt is enclosed by an insulating layer.

* * * * *